United States Patent
Li et al.

(10) Patent No.: US 12,191,320 B2
(45) Date of Patent: Jan. 7, 2025

(54) DISPLAY PANEL INCLUDING LOAD COMPENSATION UNITS AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wenqiang Li, Beijing (CN); Long Han, Beijing (CN); Ling Shi, Beijing (CN); Ke Liu, Beijing (CN); Xuewei Tian, Beijing (CN); Kuo Sun, Beijing (CN); Pinfan Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/627,768

(22) PCT Filed: Mar. 9, 2021

(86) PCT No.: PCT/CN2021/079692
§ 371 (c)(1),
(2) Date: Jan. 17, 2022

(87) PCT Pub. No.: WO2021/213034
PCT Pub. Date: Oct. 28, 2021

(65) Prior Publication Data
US 2024/0072074 A1 Feb. 29, 2024

(30) Foreign Application Priority Data
Apr. 21, 2020 (CN) .......................... 202010316872.4

(51) Int. Cl.
*H01L 27/12* (2006.01)

(52) U.S. Cl.
CPC ........ *H01L 27/1255* (2013.01); *H01L 27/124* (2013.01); *G09G 2320/0223* (2013.01)

(58) Field of Classification Search
CPC ............... H10K 59/131; H10K 59/121; H10K 59/1213; G09G 2300/0426;
(Continued)

(56) References Cited

U.S. PATENT DOCUMENTS

2017/0193914 A1* 7/2017 Heo ........................ H10K 59/12
2018/0158417 A1 6/2018 Dongxu et al.
(Continued)

FOREIGN PATENT DOCUMENTS

CN 106991990 A 7/2017
CN 107481669 A 12/2017
(Continued)

OTHER PUBLICATIONS

Wang, Bao Nan, Machine Translation of Foreign Patent Document CN110751926A, Display panel and display device, Apr. 4, 2020, pp. 1-24 (Year: 2020).*
(Continued)

*Primary Examiner* — Amr A Awad
*Assistant Examiner* — Maheen I Javed
(74) *Attorney, Agent, or Firm* — IPro, PLLC

(57) ABSTRACT

A display panel and a display device. Because the pixel distribution density in a second display subarea (A12) is lower than that in a first display subarea (A11), the quantities of sub-pixels (pix) connected to scanning lines are not completely the same; a sub-pixel row having the greatest quantity of sub-pixels (pix) in the display panel is taken as a reference sub-pixel row, the quantity of the sub-pixels (pix) of the reference sub-pixel row is taken as a reference value, a sub-pixel row having the quantity of sub-pixels (pix) smaller than the reference value is taken as a compen-
(Continued)

sation sub-pixel row, and a scanning line connected to the compensation sub-pixel row is taken as a first scanning line; the display panel is provided with load compensation units corresponding to at least part of the first scanning lines, and the load compensation units are located in the second display subarea.

16 Claims, 6 Drawing Sheets

(58) Field of Classification Search
CPC ... G09G 2300/0833; G09G 2300/0842; G09G 2310/08; G09G 2320/02; G09G 2300/0819; G09G 2310/0251; G09G 2320/0223; G09G 3/3233; G09G 3/3225; H01L 27/1214
See application file for complete search history.

(56) References Cited

U.S. PATENT DOCUMENTS

| | | | | |
|---|---|---|---|---|
| 2018/0166018 A1* | 6/2018 | Yang | ................. | G09G 3/3266 |
| 2018/0342194 A1* | 11/2018 | Li | ................. | G09G 3/3266 |
| 2018/0342572 A1 | 11/2018 | Park et al. | | |
| 2020/0335043 A1 | 10/2020 | Zhao et al. | | |
| 2020/0411623 A1 | 12/2020 | Cui et al. | | |
| 2022/0190056 A1 | 6/2022 | Guo et al. | | |

FOREIGN PATENT DOCUMENTS

| | | | | |
|---|---|---|---|---|
| CN | 107610636 A | | 1/2018 | |
| CN | 109061975 A | | 12/2018 | |
| CN | 109801565 A | | 5/2019 | |
| CN | 109801947 A | | 5/2019 | |
| CN | 110265454 A | * | 9/2019 | |
| CN | 110297365 A | | 10/2019 | |
| CN | 110364109 A | | 10/2019 | |
| CN | 110610675 A | | 12/2019 | |
| CN | 209843713 U | | 12/2019 | |
| CN | 110751926 A | * | 2/2020 | ........... G09G 3/3208 |
| CN | 110783498 A | | 2/2020 | |
| CN | 111489655 A | | 8/2020 | |
| KR | 20090005651 A | | 1/2009 | |

OTHER PUBLICATIONS

Wu et al., Machine Translation of Foreign Patent Document CN 110265454A, Display panel and manufacturing method thereof and display device, Sep. 20, 2019, pp. 1-34 (Year: 2019).*
CN202010316872.4 first office action.
CN202010316872.4 second office action.

* cited by examiner

DISPLAY PANEL INCLUDING LOAD COMPENSATION UNITS AND DISPLAY DEVICE

CROSS-REFERENCE TO RELATED APPLICATION

This application is a national phase entry under 35 U.S.C § 371 of International Application No. PCT/CN2021/079692, filed Mar. 9, 2021, which claims priority to Chinese Patent Application No. 202010316872.4, filed to the China National Intellectual Property Administration on Apr. 21, 2020 and entitled "DISPLAY PANEL AND DISPLAY DEVICE".

FIELD

The present disclosure relates to the technical field of display, in particular to a display panel and a display device.

BACKGROUND

A new challenge is put forward to pattern design of a display screen according to increasingly-updated customer requirements, and in order to achieve a more amazing display effect, a design of a screen with four stretchable corners is provided. The screen achieves a higher screen-to-body ratio, and a more amazing display effect. The pixel resolution of four-corner stretching areas is lower than that of a normal display area, so that the quantity of sub-pixels in different pixel rows are different, resulting in the presence of display difference between the pixel rows to affect the display effect.

SUMMARY

Embodiments of the present disclosure provide a display panel and a display device. The specific solution is as follows.

In a first aspect, the embodiments of the present disclosure provide a display panel, including a display area and a bezel area surrounding the display area, the display area includes a plurality of sub-pixels arranged in an array, and scanning lines connected to rows of the sub-pixels respectively;
  the display area includes a first display subarea and a second display subarea, and the second display subarea is arranged between the bezel area and the first display subarea; distribution density of sub-pixels in the second display subarea is lower than distribution density of sub-pixels in the first display subarea;
  a sub-pixel row having the greatest quantity of sub-pixels in the display panel is taken as a reference sub-pixel row, the quantity of sub-pixels in the reference sub-pixel row is taken as a reference value, sub-pixel rows each having a quantity of sub-pixels smaller than the reference value are taken as compensation sub-pixel rows, and scanning lines connected to the compensation sub-pixel rows respectively are taken as first scanning lines; and
  the display panel is provided with load compensation units corresponding to at least part of the first scanning lines, and the load compensation units are arranged in the second display subarea.

Optionally, in the display panel provided by the embodiments of the present disclosure, the larger the quantity of sub-pixels connected to a first scanning line corresponding to the load compensation unit is, the smaller a compensation load value of the load compensation unit.

Optionally, in the display panel provided by the embodiments of the present disclosure, the load compensation units each include a compensation capacitor structure; and the larger the quantity of sub-pixels connected to the first scanning line corresponding to the compensation capacitor structures is, the smaller a capacitance value of the compensation capacitor structure.

Optionally, in the display panel provided by the embodiment of the present disclosure, the display area comprises a gate layer, a source-drain layer and a storage electrode layer;
  the compensation capacitor structure includes a first electrode and a second electrode, wherein a layer where the first electrode is located is same as one of the gate layer, the source-drain layer and the storage electrode layer, a layer where the second electrode is located is same as another one of the gate layer, the source-drain layer and the storage electrode layer, and the first electrode and the second electrode are arranged on different layers.

Optionally, in the display panel provided by the embodiments of the present disclosure, the load compensation units each include a compensation resistor structure; and
  the larger the quantity of sub-pixels connected to the first scanning line corresponding to the compensation resistor structure is, the smaller a resistance value of the compensation resistor structure.

Optionally, in the display panel provided by the embodiments of the present disclosure, the display area is in a shape of rectangle; and
  the display area includes four second display subareas, and the four second display subareas are arranged at four corners of the rectangle respectively.

Optionally, in the display panel provided by the embodiments of the present disclosure, the display panel further includes shift register units which are connected to the scanning lines respectively,
  the shift register units connected to the first scanning lines are arranged in the second display subareas.

Optionally, in the display panel provided by the embodiments of the present disclosure, the shift register units connected to the first scanning lines are located on sides, close to the first display subarea, in the second display subareas.

In a second aspect, the embodiments of the present disclosure provide a display device, including the above any display panel provided by the embodiment of the present disclosure.

DETAILED DESCRIPTION OF THE EMBODIMENTS

Figure 1:
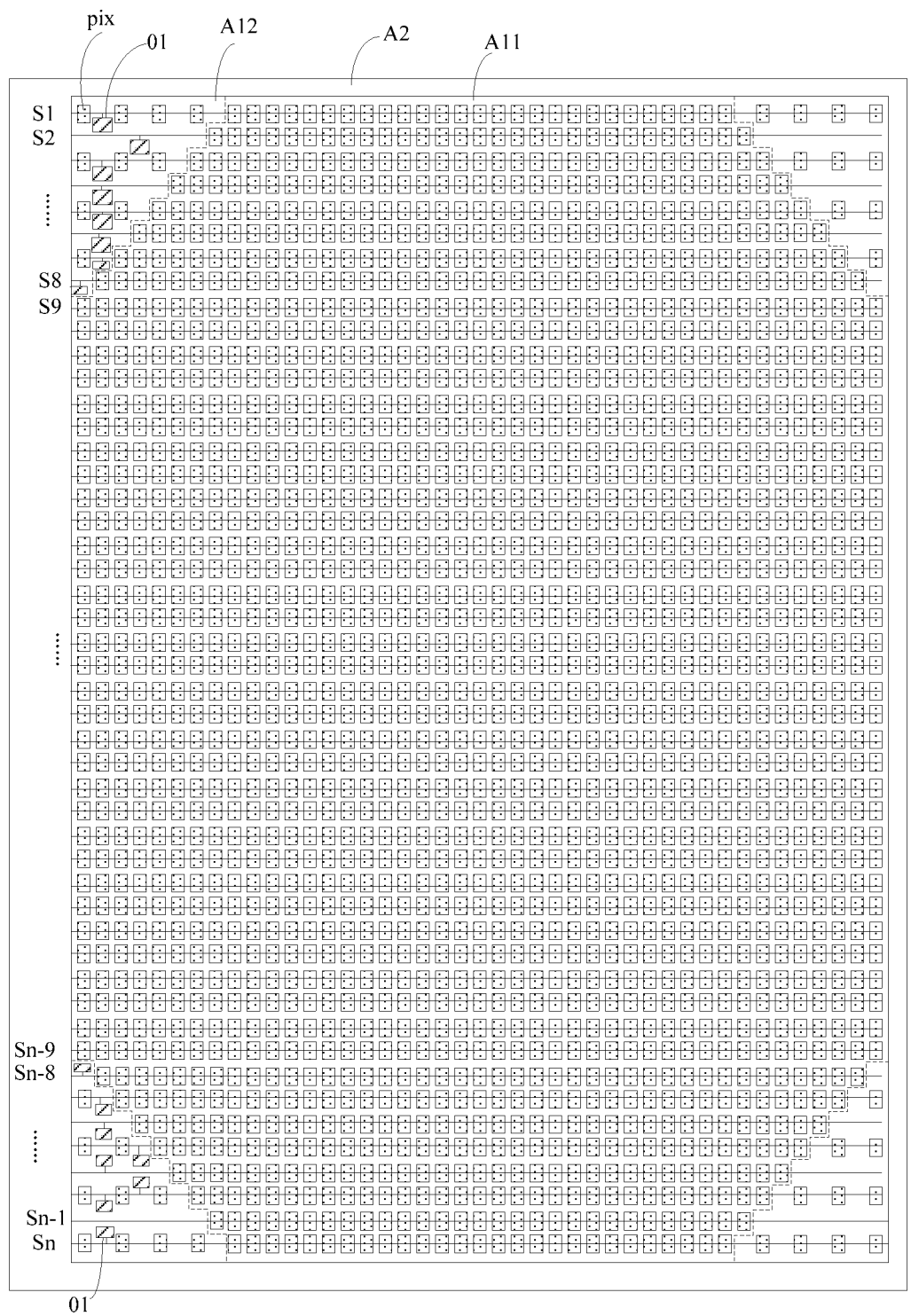
FIG. 1 is a top view of a display panel provided by an embodiment of the present disclosure.

In the related art of a screen with four stretchable corners, the pixel resolution of four-corner stretching areas is lower than that of a normal display area, so that the quantity of sub-pixels in different pixel rows are different, which enables loads on scanning lines to be different to affect a rising edge and a falling edge of an output waveform of a gate drive circuit used for outputting scanning signals to the scanning lines, thus resulting in the presence of display difference between the pixel rows to affect the display effect.

Therefore, embodiments of the present disclosure provide a display panel and a display device, configured to improve the display difference between pixel rows. In order to make the above purposes, features and advantages of the present disclosure more obvious and easy to understand, the present disclosure is further described in combination with accompanying drawings and embodiments. However, exemplary embodiments can be implemented in various forms, and should not be understood as a limitation to the embodiments set forth herein; and on the contrary, the present disclosure is more comprehensive and complete by providing these embodiments, and the concepts of the exemplary embodiments are comprehensively conveyed to those skilled in the art. The same reference numerals in the drawings represent the same or similar structures, so that repeated descriptions thereof will be omitted. Terms for describing positions and directions in the present disclosure are all explained by taking the drawings as examples, but can also be subjected to changes according to needs, and the changes are included in the protection scope of the present disclosure. The drawings of the present disclosure are only used for indicating that the relative position relation and do not represent true scales.

It should be noted that specific details are illustrated in the following description to facilitate sufficient understanding on the present disclosure. However, the present disclosure can be implemented in other ways other than those described herein, and those skilled in the art can make similar extensions without violating the connotation of the present disclosure. Therefore, the present disclosure is not limited by the specific embodiments disclosed below. The follow-up description of the specification is about preferred embodiments for implementing the present application, and the description is still intended to explain the general principle of the present application, rather than limiting the scope of the present application. The protection scope of the present disclosure is based on the definition of the appended claims.

A display panel and a display device provided by the embodiments of the present disclosure are specifically described in combination with the drawings below.

The display panel provided by the embodiments of the present disclosure, as shown in FIG. 1, includes a display area (A11 and A12) and a bezel area A2 surrounding the display area, wherein the display area includes a plurality of sub-pixels pix arranged in a matrix, and scanning lines S1 to Sn connected to respective rows of sub-pixels pix.

The display area includes a first display subarea A11 and second display subarea A12, and the second display subarea A12 is arranged between the bezel area A2 and the first display subarea A11; the distribution density of sub-pixels pix in the second display subarea A12 is smaller than distribution density of sub-pixels pix in the first display subarea A11.

A sub-pixel row having the greatest quantity of sub-pixels in the display panel is taken as a reference sub-pixel row (such as sub-pixel rows connected to the scanning lines S9 to Sn-9 in FIG. 1), the quantity of sub-pixels in the reference sub-pixel row is taken as a reference value, sub-pixel rows each having a quantity of sub-pixels pix smaller than the reference value are taken as compensation sub-pixel rows (such as sub-pixel rows connected to the scanning lines S1 to S8 and Sn-8 to Sn in FIG. 1), and the scanning lines connected to the compensation sub-pixel rows respectively are taken as first scanning lines (such as the scanning lines S1 to S8, Sn-8 to Sn in FIG. 1).

Figure 2:
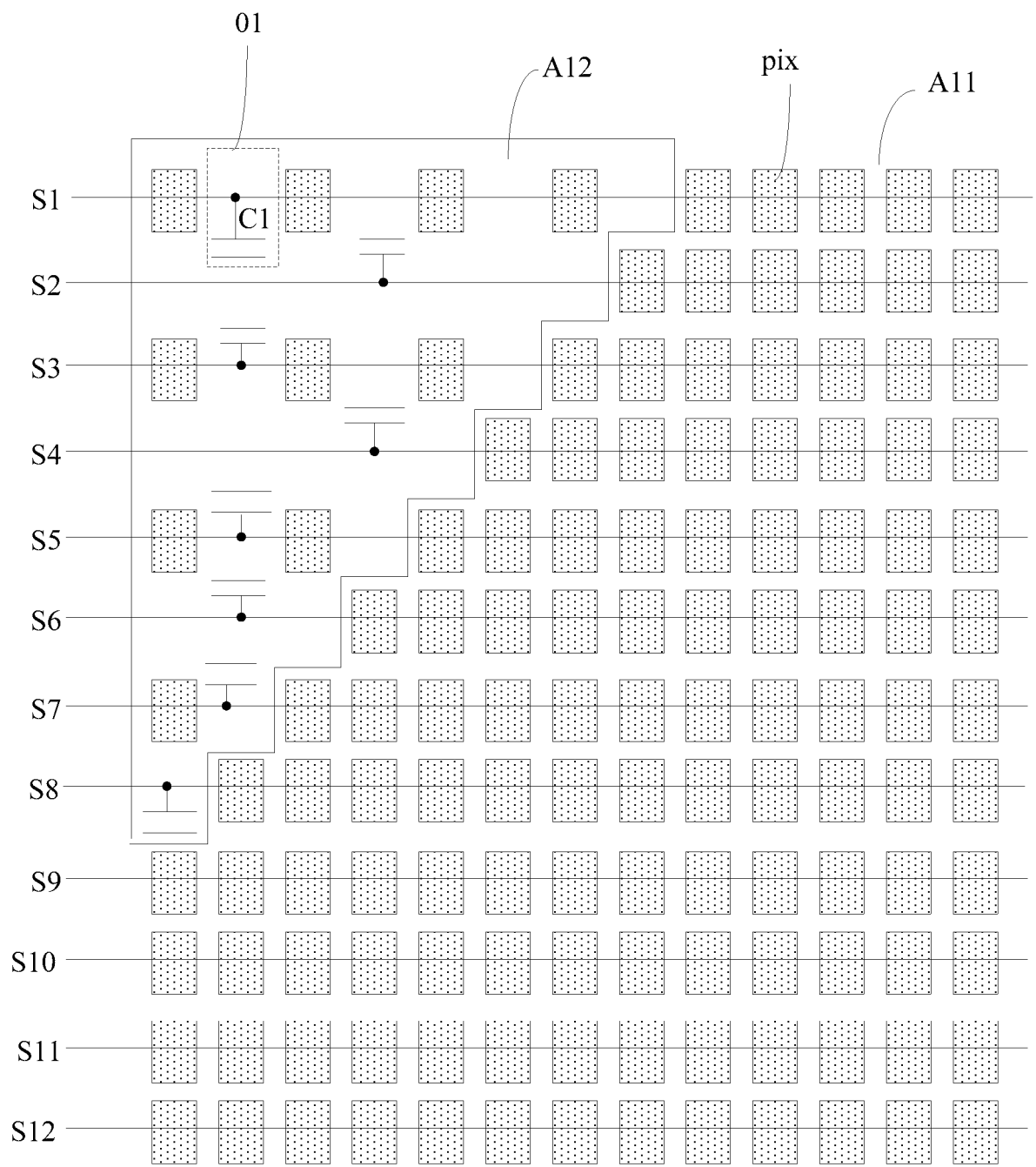
FIG. 2 is a top view of a local part of the display panel provided by an embodiment of the present disclosure.
Figure 3:
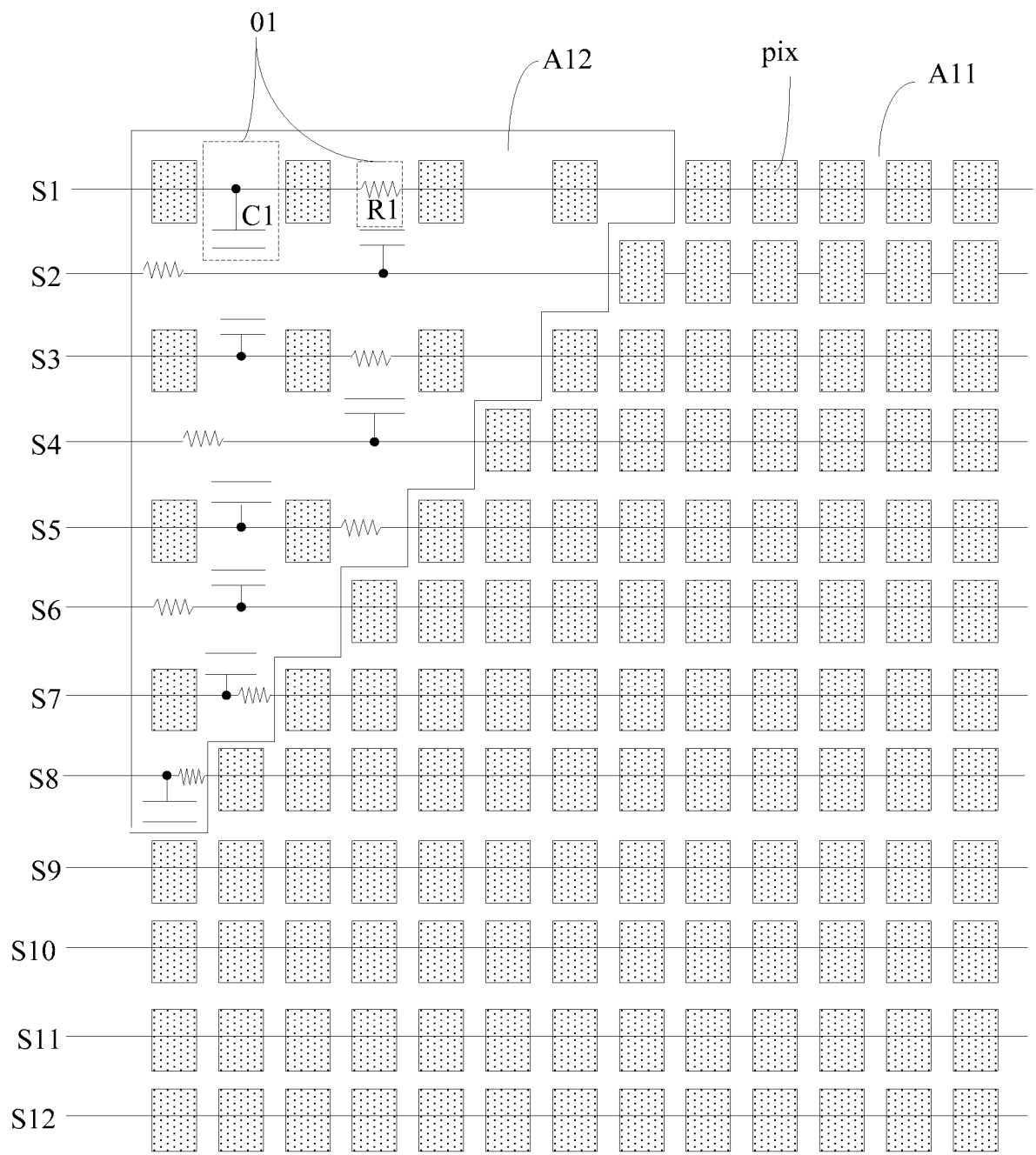
FIG. 3 is a top view of a local part of another display panel provided by an embodiment of the present disclosure.

As shown in FIG. 2 and FIG. 3, the FIG. 2 and FIG. 3 are structural schematic diagrams of a local part of the display panel in FIG. 1, the display panel is further provided with load compensation units 01 corresponding to at least part of the first scanning lines (such as the scanning lines S1 to S8 in FIG. 2 and FIG. 3), and the load compensation units 01 are arranged in the second display subarea A12.

According to the display panel provided by the embodiments of the present disclosure, as the distribution density of the pixel in the second display subarea is lower than the distribution density of the pixel in the first display subarea, the quantity of sub-pixels connected to the scanning lines are not completely the same; the sub-pixel row having the greatest quantity of sub-pixels in the display panel is taken as the reference sub-pixel row, the quantity of sub-pixels in the reference sub-pixel row is taken as the reference value, the sub-pixel rows each having a quantity of the sub-pixels smaller than the reference value are taken as the compensation sub-pixel rows, and the scanning lines connected to the compensation sub-pixel rows respectively are taken as the first scanning lines. The display panel is provided with the load compensation units corresponding to at least part of the first scanning lines. The load compensation units are utilized for compensating the load difference on the scanning lines connected to different quantities of the sub-pixels, so that the loads on the different scanning lines are uniform, the display difference is avoided, and the display quality is ensured. In addition, due to the fact that the distribution density of the sub-pixels in the second display subarea is relatively small, the influence on pixel aperture ratio of the second display subarea can be avoided by arranging the load compensation units in the second display subarea.

Accordingly, the smaller the quantities of the sub-pixels connected to the first scanning lines, the smaller the loads on the first scanning lines, and the larger the loads needing to be compensated. Therefore, optionally, in the display panel provided by the embodiments of the present disclosure, the more the quantity of the sub-pixels connected to a first scanning lines corresponding to a load compensation unit is, the smaller a compensation load value of the load compensation unit. The load compensation units with different compensation load values are utilized for compensating the first scanning lines having different quantities of the sub-pixels, so that the loads on the different scanning lines are uniform, the display difference is avoided, and the display quality is ensured.

In an optional implementation, in the display panel provided by the embodiments of the present disclosure, the compensation to the first scanning lines can be determined according to the difference between the quantity of the sub-pixels connected to the first scanning lines and the reference value. If the difference is in a certain range, and the loads on the scanning lines are not enough to affect display, the load compensation units do not need to be arranged; and if a greater difference is present, the load compensation values of the load compensation units are determined according to the difference of the quantity of the sub-pixels connected to the first scanning lines and the reference value.

Optionally, in the display panel provided by the embodiments of the present disclosure, the first scanning lines each is provided with a load compensation units in a one-to-to correspondence, so that the same load on the respective scanning lines can be ensured.

The research finds that the load difference on the first scanning lines caused by the capacitance difference greatly influences the display uniformity. Therefore, optionally, in the display panel provided by the embodiments of the present disclosure, as shown in FIG. 2, the load compensation units 01 each includes a compensation capacitor structure Cl; and the larger the quantity of the sub-pixels pix connected to the first scanning line corresponding to the compensation capacitor structure Cl is, the smaller a capacitance value of the compensation capacitor structure Cl.

Further, the quantities of the sub-pixels on the scanning lines are different, thereby resulting in resistance difference. Therefore, optionally, in the display panel provided by the embodiments of the present disclosure, as shown in FIG. 3, the load compensation units 01 each includes a compensation resistor structure R1; and the larger the quantity of sub-pixels pix connected to the first scanning line corresponding to the compensation resistor structure R1 is, the smaller a resistance value of the compensation resistor structure.

Optionally, in the display panel provided by the embodiment of the present disclosure, as shown in FIG. 3, the load compensation units 01 each includes the compensation capacitor structure Cl and the compensation resistor structure R1, namely, the load compensation units 01 compensate the capacitance values and the resistance values on the first scanning lines.

In an optional implementation, in the display panel provided by the embodiments of the present disclosure, each sub-pixel generally includes a transistor, a storage capacitor, a light emitting diode, etc., wherein the transistor includes an active layer, a gate layer and a source-drain layer, and the storage capacitor generally includes a storage electrode layer.

Therefore, optionally, in the display panel provided by the embodiments of the present disclosure, the display area includes a gate layer, a source-drain layer and a storage electrode layer; and the compensation capacitor structure includes a first electrode and a second electrode.

Optionally, in the display panel provided by the embodiments of the present disclosure, a layer where the first electrode is located is same as one of the gate layer, the source-drain layer and the storage layer, a layer where the second electrode is located is same as another one of the gate layer, the source-drain layer and the storage electrode layer, and the first electrode and the second electrode are arranged on different layers. For example, the first electrode and the gate layer are arranged on the same layer, and the second electrode and the source-drain layer are arranged on the same layer. Alternatively, the first electrode and the source-drain layer are arranged on the same layer, and the second electrode and the storage electrode layer are arranged on the same layer. Alternatively, the first electrode and the gate layer are arranged on the same layer, and the second electrode and the storage electrode layer are arranged on the same layer.

In an optional implementation, the electrode layer of each compensation capacitor structure and the original gate layer, the source-drain layer or the storage electrode layer in the display panel are arranged on the same layer, no additional composition process is required to be added, only the pattern in the original composition process needs to be modified, and thus the cost can be reduced.

Figure 4:
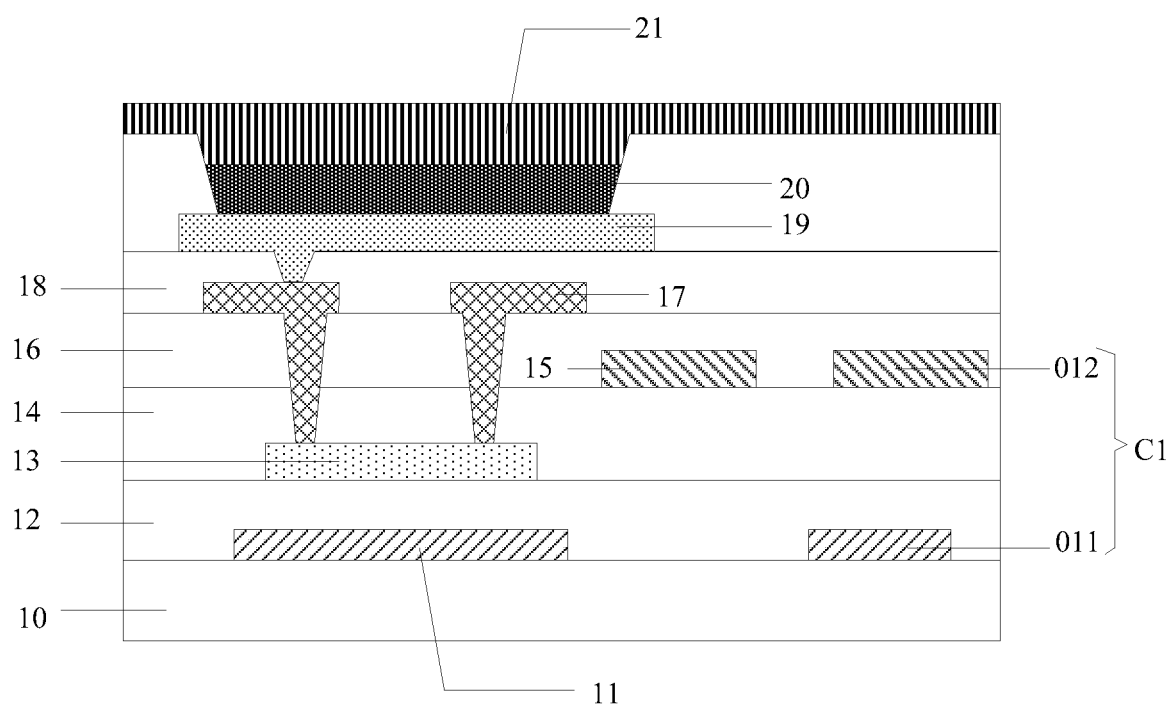
FIG. 4 is a section view of the display panel provided by an embodiment of the present disclosure.

Accordingly, in an example of taking a transistor in the display panel as a bottom gate type structure, as shown in FIG. 4, a base substrate 10 includes a gate layer 11, a gate insulating layer 12, an active layer 13, a first interlayer dielectric layer 14, a storage electrode layer 15, a second interlayer dielectric layer 16, a source-drain layer 17, a planarization layer 18, an anode layer 19, a light emitting layer 20 and a cathode layer 21 in sequence, wherein the first electrode 011 of the compensation capacitor structure Cl and the gate layer 11 are arranged on the same layer, and the second electrode 012 and the storage electrode layer 15 are arranged on the same layer.

Optionally, in the display panel provided by the embodiments of the present disclosure, each compensation capacitor structure includes a plurality of capacitors which are connected in parallel, so that the capacitors can be respectively arranged between the sub-pixels of the second display subarea to avoid affecting the pixel aperture ratio by too large area of the single capacitor.

In an optional implementation, for a screen with a four-corner stretchable structure, due to the fact that the four corners can deform during later module fitting, the sub-pixels of the four corners are specially designed, namely, distribution density of the sub-pixels in the four corners is lower than distribution density of the sub-pixels in the middle area.

Therefore, optionally, in the display panel provided by the embodiments of the present disclosure, as shown in FIG. 1, the display area is in the shape of rectangle; and the display area includes four second display subareas A12, and the four second display subareas A12 are located at the four corners of the rectangle respectively, that is, the display panel is applied to the design of the screen with the four stretchable corners.

Figure 5:
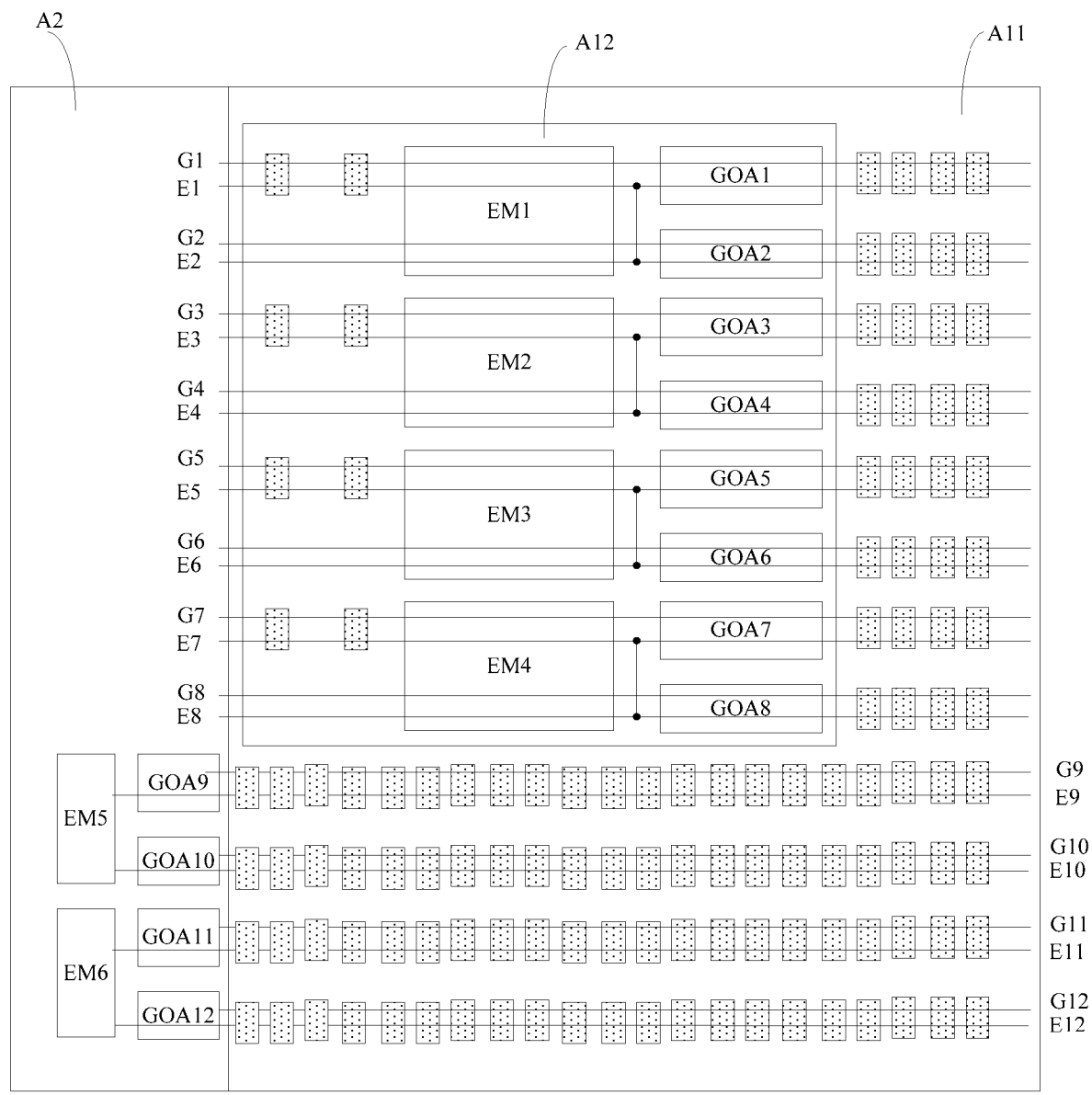
FIG. 5 is a top view of a local part of another display panel provided by an embodiment of the present disclosure.

Furthermore, in the display panel provided by the embodiments of the present disclosure, as shown in FIG. 5, the display panel further includes shift register units (GOA1 to GOA12 and EM1 to EM6 in FIG. 5) which are connected to the scanning lines respectively (G1 to G12 and E1 to E12 in FIG. 5).

The shift register units connected to the first scanning lines (G1 to G8 and E1 to E8 in FIG. 5) are arranged in the second display subareas A12. The shifting register units can be prevented from being damaged in the stretching process, and also display can be prevented from being affected.

In an optional implementation, in the display panel provided by the embodiment of the present disclosure, as shown in FIG. 5, the shift register units (such as GOA9 to GOA12, EM5 to EM6 in FIG. 5) connected with other scanning lines (such as G9 to G12, E9 to E12 in FIG. 5) except the first scanning lines are arranged in the bezel area A2, so that the influence of the shift register units on the pixel aperture ratio of the first display subarea can be avoided.

In an optional implementation, in the display panel provided by the embodiments of the present disclosure, the scanning lines may include gate scanning lines, may also include light emitting control scanning lines, or may also include the gate scanning lines and the light emitting control scanning lines at the same time, which are not limited here.

In an optional implementation, in an OLED display panel, the scanning lines include gate scanning lines and light emitting control scanning lines, and shift registers include gate driving shift registers and light emitting control shift registers. As shown in FIG. 5, the gate driving shift registers GOAn generally adopt a one-driving-one mode, i.e., one gate driving shift register GOAn is connected to one row of sub-pixels pix through one gate scanning line Gn. The light emitting control shift registers EMn generally adopt a one-driving-two mode, namely one light emitting control shift register EMn is connected to two rows of sub-pixels pix through two light emitting control scanning lines En and En+1 respectively.

In an optional implementation, no matter how the driving mode of the shift registers is, the compensation load values of the load compensation units are determined according to difference in the quantity of the sub-pixels connected onto the scanning lines.

In an optional implementation, in the display panel provided by the embodiments of the present disclosure, when the light emitting control shift registers generally adopt the one-driving-two mode, if one light-emitting control shift register drives one reference sub-pixel row and one compensation sub-pixel row, so that the compensation load value for the same light emitting control shift register is relatively small, which is beneficial to the utilization of a layout space. If one light emitting control shift register drives two reference sub-pixel rows simultaneously, the next light emitting control shift register needs to drive two compensation sub-pixel rows simultaneously, so that the relatively large compensation load value is required for the two compensation sub-pixel rows which are simultaneously driven. The large compensation load value means that the occupied areas of the load compensation units are large, which is not beneficial to the utilization of the layout space.

Optionally, in the display panel provided by the embodiments of the present disclosure, as shown in FIG. 5, the shift register units connected to the first scanning lines (such as G1 to G8, E1 to E8 in FIG. 5) are located on sides, close to the first display subarea A11, in the second display subareas A12, so that the shift register units can be far away from a stretching area to avoid damaging the shift register units.

Figure 6:
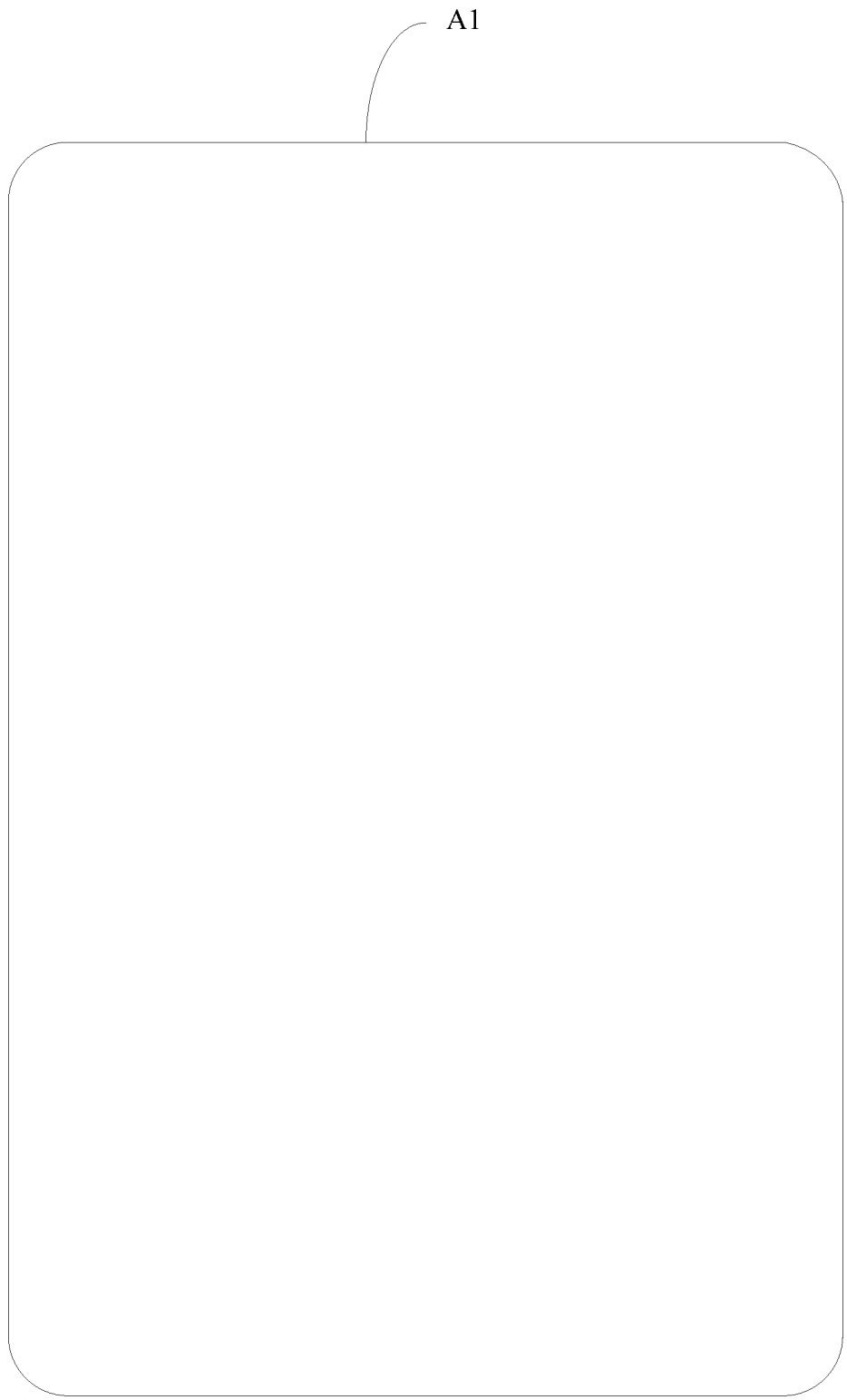
FIG. 6 is a schematic diagram of a shape of a display area of another display panel provided by an embodiment of the present disclosure.

Optionally, in the display panel provided by the embodiments of the present disclosure, as shown in FIG. 6, the display area A1 is in the shape of rectangle, and the four corners of the rectangle are designed to be round corners, which is beneficial to the attractive appearance of the display panel.

In an optional implementation, when the four corners of the display area are designed to be round corners, the farther the sub-pixel row in the second display subareas away from the center of the first display subarea is, the smaller the quantity of sub-pixels included in the sub-pixel row, and therefore the compensation capacitance value of the corresponding load compensation unit is larger.

Certainly, in an optional implementation, the four corners of the display area can also be designed to be right-angle corners, which are not limited here.

Based on the same inventive concept, the embodiments of the present disclosure further provide a display device which includes the above any display panel provided by the embodiments of the present disclosure. The display device can be any product or part with a display function, such as a mobile phone, a tablet personal computer, a television, a display, a notebook computer, a digital photo frame, and a navigator. The implementation of the display device can refer to the embodiments of the display panel, and the repetitions are not described.

According to the display panel provided by the embodiments of the present disclosure, as the distribution density of pixel in the second display subareas is lower than that in the first display subarea, the quantity of sub-pixels connected onto the scanning lines are not completely the same, the sub-pixel row having the greatest quantity of sub-pixels in the display panel is taken as the reference sub-pixel row, the quantity of sub-pixels in the reference sub-pixel row is taken as the reference value, the sub-pixel rows each having a quantity of sub-pixels smaller than the reference value are taken as the compensation sub-pixel rows, and the scanning lines connected to the compensation sub-pixel rows respectively are taken as the first scanning lines. The display panel is further provided with the load compensation units corresponding to at least part of the first scanning lines. The load compensation units are utilized for compensating the load difference on the scanning lines connected to different quantities of the sub-pixels, so that the loads on the different scanning lines are uniform, the display difference is avoided, and the display quality is ensured. In addition, due to the fact that the distribution density of the sub-pixels in the second display subarea is relatively small, the influence on pixel aperture ratio of the second display subarea can be avoided by arranging the load compensation units in the second display subarea.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent techniques, the present disclosure is also intended to include these modifications and variations.

What is claimed is:

1. A display panel, comprising:
    a display area; and a bezel area surrounding the display area, wherein the display area comprises: a plurality of sub-pixels arranged in an array, and scanning lines connected to rows of the sub-pixels respectively;
    the display area comprises: a first display sub-area, and a second display sub-area, wherein the second display sub-area is arranged between the bezel area and the first display sub-area;
    distribution density of sub-pixels in the second display sub-area is lower than distribution density of sub-pixels in the first display sub-area;
    wherein a sub-pixel row having a greatest quantity of sub-pixels in the display panel is taken as a reference sub-pixel row, the quantity of sub-pixels in the reference sub-pixel row is taken as a reference value, sub-pixel rows each having a quantity of sub-pixels smaller than the reference value are taken as compensation sub-pixel rows, and scanning lines connected to the compensation sub-pixel rows respectively are taken as first scanning lines; and
    the display panel is provided with load compensation units corresponding to at least part of the first scanning lines, and the load compensation units are arranged in the second display sub-area;
    wherein the display panel further comprises shift register units which are connected to the scanning lines respectively; and wherein shift register units connected to the first scanning lines are arranged only in the second display sub-area; and
    wherein each of the load compensation units comprises a compensation capacitor structure and a compensation resistor structure, and the compensation capacitor structure comprises a plurality of capacitors which are connected in parallel.

2. The display panel according to claim 1, wherein the larger a quantity of sub-pixels connected to a first scanning line corresponding to a load compensation unit is, the smaller a compensation load value of the load compensation unit.

3. The display panel according to claim 2, wherein
the larger the quantity of sub-pixels connected to the first scanning line corresponding to the compensation capacitor structure is, the smaller a capacitance value of the compensation capacitor structure.

4. The display panel according claim 3, wherein the display area comprises a gate layer, a source-drain layer and a storage electrode layer; and
the compensation capacitor structure comprises a first electrode and a second electrode; wherein a layer where the first electrode is located is same as one of the gate layer, the source-drain layer and the storage electrode layer, a layer where the second electrode is located is same as another one of the gate layer, the source-drain layer and the storage electrode layer, and the first electrode and the second electrode are arranged on different layers.

5. The display panel according to claim 2, wherein
the larger the quantity of sub-pixels connected to the first scanning line corresponding to the compensation resistor structure is, the smaller a resistance value of the compensation resistor structure.

6. The display panel according to claim 1, wherein the display area is in a shape of rectangle; and
the display area comprises four second display sub-areas, and the four second display sub-areas are arranged at four corners of the rectangle respectively.

7. The display panel according to claim 1, wherein the shift register units connected to the first scanning lines are arranged on a side, close to the first display sub-area, in the second display sub-areas.

8. The display panel according to claim 1, wherein the compensation capacitor structure and compensation resistor structure do not overlap in a direction perpendicular to the display panel.

9. A display device, comprising a display panel, wherein the display panel comprises:
a display area; and a bezel area surrounding the display area, wherein the display area comprises: a plurality of sub-pixels arranged in an array, and scanning lines connected to rows of the sub-pixels respectively; the display area comprises:
a first display sub-area, and a second display sub-area, wherein the second display sub-area is arranged between the bezel area and the first display sub-area; distribution density of sub-pixels in the second display sub-area is lower than distribution density of sub-pixels in the first display sub-area;
wherein a sub-pixel row having a greatest quantity of sub-pixels in the display panel is taken as a reference sub-pixel row, the quantity of sub-pixels in the reference sub-pixel row is taken as a reference value, sub-pixel rows each having a quantity of sub-pixels smaller than the reference value are taken as compensation sub-pixel rows, and scanning lines connected to the compensation sub-pixel rows respectively are taken as first scanning lines; and the display panel is provided with load compensation units corresponding to at least part of the first scanning lines, and the load compensation units are arranged in the second display sub-area;
wherein the display panel further comprises shift register units which are connected to the scanning lines respectively; and wherein shift register units connected to the first scanning lines are arranged only in the second display sub-area; and
wherein each of the load compensation units comprises a compensation capacitor structure and a compensation resistor structure, and the compensation capacitor structure comprises a plurality of capacitors which are connected in parallel.

10. The display device according to claim 9, wherein the larger a quantity of sub-pixels connected to a first scanning line corresponding to a load compensation unit is, the smaller a compensation load value of the load compensation unit.

11. The display device according to claim 10, wherein
the larger the quantity of sub-pixels connected to the first scanning line corresponding to the compensation capacitor structure is, the smaller a capacitance value of the compensation capacitor structure.

12. The display device according to claim 11, wherein the display area comprises a gate layer, a source-drain layer and a storage electrode layer; and
the compensation capacitor structure comprises a first electrode and a second electrode; wherein a layer where the first electrode is located is same as one of the gate layer, the source-drain layer and the storage electrode layer, a layer where the second electrode is located is same as another one of the gate layer, the source-drain layer and the storage electrode layer, and the first electrode and the second electrode are arranged on different layers.

13. The display device according to claim 10, wherein
the larger the quantity of sub-pixels connected to the first scanning line corresponding to the compensation resistor structure is, the smaller a resistance value of the compensation resistor structure.

14. The display device according to claim 9, wherein the display area is in a shape of rectangle; and
the display area comprises four second display sub-areas, and the four second display sub-areas are arranged at four corners of the rectangle respectively.

15. The display device according to claim 9, wherein the shift register units connected to the first scanning lines are arranged on a side, close to the first display sub-area, in the second display sub-areas.

16. The display device according to claim 9, wherein the compensation capacitor structure and compensation resistor structure do not overlap in a direction perpendicular to the display panel.

* * * * *